(12) United States Patent
Hommel et al.

(10) Patent No.: US 6,900,466 B2
(45) Date of Patent: May 31, 2005

(54) SEMICONDUCTOR COMPONENT FOR GENERATING POLYCHROMATIC ELECTROMAGNETIC RADIATION

(75) Inventors: Detlef Hommel, Bremen (DE); Helmut Wenisch, Sagamihara (JP)

(73) Assignee: Osram GmbH, Munich (DE)

( * ) Notice: Subject to any disclaimer, the term of this patent is extended or adjusted under 35 U.S.C. 154(b) by 0 days.

(21) Appl. No.: 09/915,985

(22) Filed: Jul. 25, 2001

(65) Prior Publication Data

US 2002/0008244 A1 Jan. 24, 2002

Related U.S. Application Data

(63) Continuation of application No. PCT/DE00/00201, filed on Jan. 25, 2000.

(30) Foreign Application Priority Data

Jan. 25, 1999 (DE) .......................................... 199 02 750

(51) Int. Cl.$^7$ ............................................ H01L 33/00
(52) U.S. Cl. ............................ 257/79; 257/17; 257/16; 257/89; 257/80; 257/86; 257/28; 257/13; 257/88; 257/97; 257/98; 257/99; 257/61; 438/22; 438/28; 313/498; 313/499
(58) Field of Search ............................ 257/13, 88, 97, 257/98, 99, 17, 16, 61, 79, 89, 80, 86; 313/498, 499; 438/22, 28

(56) References Cited

U.S. PATENT DOCUMENTS

| 4,570,172 A | * | 2/1986 | Henry et al. .................... 357/17 |
| 4,775,876 A | | 10/1988 | Moyer |
| 4,784,722 A | * | 11/1988 | Liau et al. .................... 156/649 |
| 5,084,804 A | | 1/1992 | Schairer |
| 5,198,690 A | * | 3/1993 | Kitagawa et al. ............ 257/200 |
| 5,488,233 A | * | 1/1996 | Ishikawa et al. ............... 257/94 |
| 5,966,393 A | * | 10/1999 | Hide et al. ..................... 372/23 |
| 5,998,925 A | * | 12/1999 | Shimizu et al. .............. 313/503 |
| 2002/0093023 A1 | * | 7/2002 | Camras et al. ................. 257/94 |

FOREIGN PATENT DOCUMENTS

| DE | 31 37 685 A1 | 4/1983 |
| DE | 38 35 942 A1 | 4/1990 |
| EP | 0 114 548 | 8/1984 |
| EP | 0 486 052 A1 | 5/1992 |

(Continued)

OTHER PUBLICATIONS

H. Wenisch et al.: "Internal photluminescence and lifetime of light–emitting diodes on conductive ZnSe substrates", *J. Appl. Phys.*, vol. 82, No. 9, Nov. 1, 1997, pp. 4690–4692.

(Continued)

*Primary Examiner*—Eddie Lee
*Assistant Examiner*—Junghwa Im
(74) *Attorney, Agent, or Firm*—Laurence A. Greenberg; Werner H. Stemer; Ralph E. Locher

(57) ABSTRACT

A semiconductor component for generating a polychromatic electromagnetic radiation has a semiconductor chip with a first semiconductor layer and a second semiconductor layer, which is provided adjacent to the first semiconductor layer and has an electroluminescent region. The electroluminescent region emits electromagnetic radiation of a first wavelength. The first semiconductor layer includes a material which, when excited with the electromagnetic radiation of the first wavelength, re-emits radiation with a second wavelength which is longer than the first wavelength.

7 Claims, 2 Drawing Sheets

FOREIGN PATENT DOCUMENTS

| EP | 0 971 421 A2 | 1/2000 | |
|---|---|---|---|
| EP | 0 977 278 A2 | 2/2000 | |
| JP | 10056203 | 8/1996 | |
| JP | 10261818 | 3/1997 | |
| JP | 09204982 | * 8/1997 | ........... H05B/33/22 |
| JP | 11274558 | 3/1998 | |
| JP | 10282494 | * 10/1998 | ......... G02F/1/1335 |
| WO | PCT/SE92/00210 | 11/1992 | |
| WO | WO 97/23912 | 7/1997 | |
| WO | PCT/DE97/01337 | 12/1997 | |

OTHER PUBLICATIONS

K. Ohkawa et al.: "ZnSe–Based Laser Diodes and LEDs Grown on ZnSe and GaAs Substrates", *phys. stat. sol.(b)*, No. 202, 1997, pp. 683–693.

Michael Prokesch et al.: "Variable High Conductivity in Homogeneously Iodine Doped ZnSe Bilk Substrates with Simultaneous High Crystallographic Perfection", *2nd Intern. Symp. On Blue Laser and Light Emitting Diodes*, Chiba, Japan, Sep. 29–Oct. 2, 1998, Th–P47, pp. 624–637.

H. Wenisch et al.: "(Cd,Zn)Se multi–quantum–well LEDs: homoepitaxy on ZnSe substrates and heteroepitaxy on (In, Ga)As/GaAs buffer layers",*Journal of Crystal Growth*, No. 159, 1996, pp. 26–31.

Chi Zhang et al.: "Gallium nitride/conjugated polymer hybrid light emitting diodes: Performance and lifetime", *Journal of Applied Physics*, vol. 84, No. 3, Aug. 1, 1998, pp. 1579–1582.

Yu et al.: "Blue–green laser diodes on ZnSe substrates", Electronics Letters, Aug. 3, 1995, vol. 31, No. 16, pp. 1341–1342.

Gumlich: "Some Aspects of Impurities in WIde–Band Gap II–VI Compounds", Growth and Optical Properties of Wide–Gap II–VI Low–Dimensional Semiconducdtors, Plenum Press, New York and London, NATO ASI Series B: Physics vol. 200, 1989, pp. 109–118.

Kukimoto: "Conductivity Control of Wide Gap II–VI Compounds", NATO ASI Series B, Physics vol. 200, Plenum Press, New York, 1998, pp. 119–127.

* cited by examiner

SEMICONDUCTOR COMPONENT FOR GENERATING POLYCHROMATIC ELECTROMAGNETIC RADIATION

CROSS-REFERENCE TO RELATED APPLICATION

This application is a continuation of copending International Application No. PCT/DE00/00201, filed Jan. 25, 2000, which designated the United States.

BACKGROUND OF THE INVENTION

FIELD OF THE INVENTION

The invention relates to a semiconductor component for generating a polychromatic electromagnetic radiation, in particular white light. The semiconductor component has a semiconductor chip having a first semiconductor layer and a second semiconductor layer which is provided adjacent to the first semiconductor layer and has an electroluminescent region.

White light is nowadays usually generated by incandescent lamps or fluorescent tubes which emit light with a wide wavelength spectrum.

By contrast, light-emitting semiconductor components, such as light-emitting diodes (LEDs) or semiconductor laser diodes, have an emission spectrum which is typically only 10 to 25 nm wide, i.e. they are virtually monochromatic. However, they have the particular advantage that they require only a fraction of the current required by an incandescent lamp or a fluorescent tube. Moreover, their service life is distinctly longer than that of incandescent lamps or fluorescent tubes. If a large-area emitter is necessary, LEDs or laser diodes can be connected together in a simple manner to form arrays.

By using LEDs of the three primary colors, red, green and blue or of the two complementary colors blue and yellow, it is possible, through the use of additive color mixing, to generate light which appears white to the human eye. Particular disadvantages in this case are, however, that three or two light-emitting diodes have to be electrically driven individually, thereby necessitating complicated drive electronics (different kinds of LEDs generally require different drive voltages), that a high assembly outlay is necessary, and that the component miniaturization is greatly limited.

International Publication No. WO97/50132 describes a light-emitting diode component which emits white light and in which, by way of example, a luminescence conversion layer containing YAG phosphorus is applied to a light-emitting diode chip which emits blue light. The luminescence conversion layer emits in the yellow spectral region when excited by blue light or UV radiation. The eye perceives the mixed color including blue primary light and yellow secondary light as white. The additional process steps for producing the luminescence conversion layer are disadvantageous here.

SUMMARY OF THE INVENTION

It is accordingly an object of the invention to provide a semiconductor component which overcomes the above-mentioned disadvantages of the heretofore-known semiconductor components of this general type and which emits polychromatic light and which requires only little technical outlay to produce.

With the foregoing and other objects in view there is provided, in accordance with the invention, a semiconductor component for generating visible polychromatic light, including:

a semiconductor chip having a first semiconductor layer and a second semiconductor layer adjacent to the first semiconductor layer;

the second semiconductor layer including an electroluminescent region emitting visible light of a first color having a first wavelength;

the first semiconductor layer having a first band gap, the electroluminescent region having a second band gap, the first band gap being smaller than the second band gap;

the first semiconductor layer absorbing part of the visible light of the first color and the first semiconductor layer re-emitting visible light of a second color having a second wavelength, the second color being different from the first color, and the second wavelength being longer than the first wavelength; and the semiconductor chip emitting the visible light of the second color together with the visible light of the first color.

In other words, a semiconductor component for generating visible polychromatic or mixed-color light is provided which has a semiconductor chip having a first semiconductor layer and a second semiconductor layer, which is disposed adjacent to the first semiconductor layer, and the second semiconductor layer contains an electroluminescent region which emits visible light of a first color with a wavelength $\lambda_E$, wherein the first semiconductor layer has a band gap which is smaller than the band gap of the electroluminescent region and absorbs part of the light of the first color and re-emits visible light of a second color, different from the first color, with a longer wavelength $\lambda_R$, which light is emitted by the semiconductor component together with the light of the first color.

According to another feature of the invention, the first semiconductor layer and the second semiconductor layer are configured such that the semiconductor chip emits white light.

According to yet another feature of the invention, the first semiconductor layer includes a given material with an absorption edge having an energy level corresponding to a third wavelength, the third wavelength is longer than the first wavelength of the visible light emitted by the second semiconductor layer and is shorter than the second wavelength, and the given material, when excited with radiation of a wavelength shorter than the third wavelength, re-emits radiation of the second wavelength.

In a preferred embodiment, the substrate for epitaxially growing the second semiconductor layer is utilized as the first semiconductor layer.

In another preferred embodiment, both the first and the second semiconductor layers are applied through the use of epitaxy on a growth substrate.

According to a further feature of the invention, the semiconductor chip includes a growth substrate, and the first semiconductor layer is disposed between the growth substrate and the second semiconductor layer.

According to another feature of the invention, the semiconductor chip includes a growth substrate for epitaxially growing the second semiconductor layer, and the second semiconductor layer has a side opposite the growth substrate, the first semiconductor layer is disposed on the side of the second semiconductor layer opposite the growth substrate.

An advantageous embodiment has a first semiconductor layer containing ZnSe and a second semiconductor layer containing a $Cd_xZn_{1-x}Se/ZnSe$ quantum well system (where $0 \leq x \leq 1$), in particular a multiple quantum well system, as an active zone.

The term semiconductor layer in this case not only means an individual layer made of homogeneous semiconductor material, but rather can also mean a layer system or a layer sequence including a plurality of different layers and/or graduated layers.

Other features which are considered as characteristic for the invention are set forth in the appended claims.

Although the invention is illustrated and described herein as embodied in a semiconductor component for generating polychromatic electromagnetic radiation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
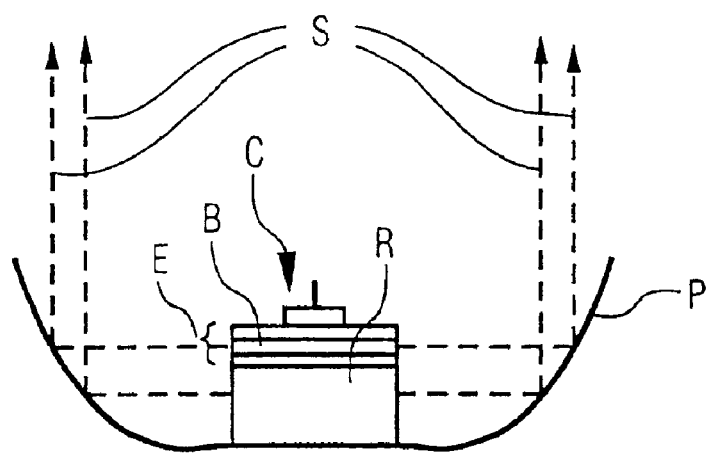
FIG. 1 is a diagrammatic sectional view of a first basic configuration of a light-emitting diode chip according to the invention.

Referring now to the figures of the drawings in detail and first, particularly, to FIG. 1 thereof, there is shown the basic configuration of a light-emitting diode chip C, wherein a functional semiconductor layer E is applied on a substrate R.

In general, the substrate R is monocrystalline and produced by pulling from a melt, cutting into thin wafers and polishing.

A functional semiconductor layer E, which hereinafter is generally referred to as emission layer E for short, is to be understood as a configuration of one or more semiconductor layers which serve for generating electromagnetic radiation when current flows through the chip in an electroluminescent region B.

With a thickness of several hundreds of $\mu$m, the substrate R is approximately by a factor of 100 thicker than the emission layer E grown epitaxially on it and is a stable mechanical support.

As is known, a typical functional semiconductor layer E of a light-emitting diode chip generally includes a plurality of semiconductor layers of different thickness, composition and doping. A p-n junction with quantum film(s) is often used as the electroluminescent region B. The thickness of the entire system is usually in the $\mu$m range.

In order to obtain targeted changes in the properties through targeted impurities (doping) or admixtures, and also the production of atomically smooth interfaces within the functional semiconductor layer E, the latter is produced for example through the use of MBE (Molecular Beam Epitaxy) and/or MOVPE (Metal Organic Vapor Phase Epitaxy).

In the exemplary embodiment in accordance with FIG. 1, the emission wavelength $\lambda_E$ of the functional semiconductor layer E is shorter than the wavelength $\lambda_{abs}$, which corresponds to the absorption edge of the substrate R.

In the substrate R, at room or operating temperature, the radiant recombination at the wavelength $\lambda_R$ (re-emission wavelength) is predominant with high effectiveness if excitation is effected using radiation of a wavelength shorter than $\lambda_{abs}$. Accordingly, the band gap of the substrate R is smaller than that of the emitting transition of the emission layer E. In the substrate R, at least part of the radiation emitted by the emission layer E in the direction of the substrate R is absorbed during operation of the light-emitting diode chip. Re-emission from the substrate R ensues at a re-emission wavelength $\lambda_R$, which is longer than $\lambda_{abs}$, states in the band gap of the substrate R being involved here.

As a result, a compact chip is realized which emits radiation S of two distinctly different wavelengths. Since both light-generating volumes are in direct proximity to one another, the human eye can be given the impression of polychromatic light and, in a special case, also of white light. This effect is additionally enhanced if the light-emitting diode chip is situated in a small parabolic mirror P, as is customary in the case of LEDs and is illustrated schematically in FIG. 1.

Figure 2:
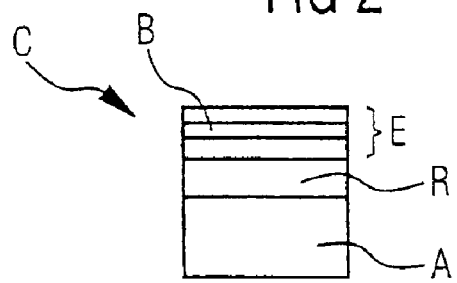
FIG. 2 is a diagrammatic sectional view of a second basic configuration of a light-emitting diode chip according to the invention.

The exemplary embodiment in accordance with FIG. 2 differs from that of FIG. 1 essentially by virtue of the fact that the absorption and re-emission do not take place in the growth substrate A, rather that a separate re-emission layer R is provided here, which is provided between the growth substrate A and the emission layer E and has the same properties as the substrate of the exemplary embodiment from FIG. 1. In this case, the growth substrate A is configured to be either transparent or absorbing and in this case serves exclusively as a growth substrate.

Figure 3:
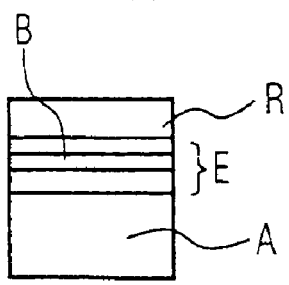
FIG. 3 is a diagrammatic sectional view of a third basic configuration of a light-emitting diode chip according to the invention.

The exemplary embodiment in accordance with FIG. 3 is essentially identical to that of FIG. 2, except for the difference that in this case the re-emission layer R is not provided between the growth substrate A and the functional semiconductor layer B, but rather is provided on that side of the emission layer E which is opposite to the growth substrate A.

By varying e.g. the quantum well thickness in a functional semiconductor layer E having a quantum well structure or the composition(s) in the functional semiconductor layer E, it is possible to set the emission wavelength $\lambda_E$ within certain limits, where the condition $\lambda_E < \lambda_{abs}$ should be observed. The position of the absorption edge of the substrate or of the re-emission layer R is determined by the choice of the substrate or re-emission layer material, respectively. The re-emission wavelength $\lambda_R$ (relative to the absorption edge A), depends on the nature of the generation of the states of the band gap.

The ratio:

(Intensity of the radiation emitted by the substrate R or re-emission layer R)/(Intensity of the radiation emitted by the functional semiconductor layer E) can be influenced in a targeted manner by:

a) the thickness of the substrate or of the re-emission layer R and thus of the absorptive and re-emitting volume (this can be achieved, e.g. by thinning);

b) the rate of radiant recombination in the substrate or re-emission layer R (this can be effected by targeted introduction of (non-) radiant recombination channels);

c) the effectiveness of the waveguide (extremely bright LEDs are constructed as so-called double heterostructures; in this case a wave-guiding effect perpendicular to the growth direction is achieved by corresponding refractive index jumps of the layers; the better this wave guiding, the fewer photons will actually pass into the substrate or into the re-emission layer R and the greater their proportion becomes in comparison with the radiation emitted by the substrate or by the re-emission layer R); and d) the position of the emission wavelength $\lambda_E$ relative to the absorption edge of the substrate or of the re-emission layer R (the closer the emission wavelength $\lambda_E$ is to the absorption edge of the substrate or of the re-emission layer R, the more transparent the substrate or the re-emission layer R becomes and the smaller the absorption/re-emission becomes there. In order to keep the substrate or re-emission layer proportion relatively low, it may also be necessary to deviate from the condition $\lambda_E < \lambda_{abs}$ if sufficient absorption takes place even for $\lambda_E < \lambda_{abs}$).

Figure 4:
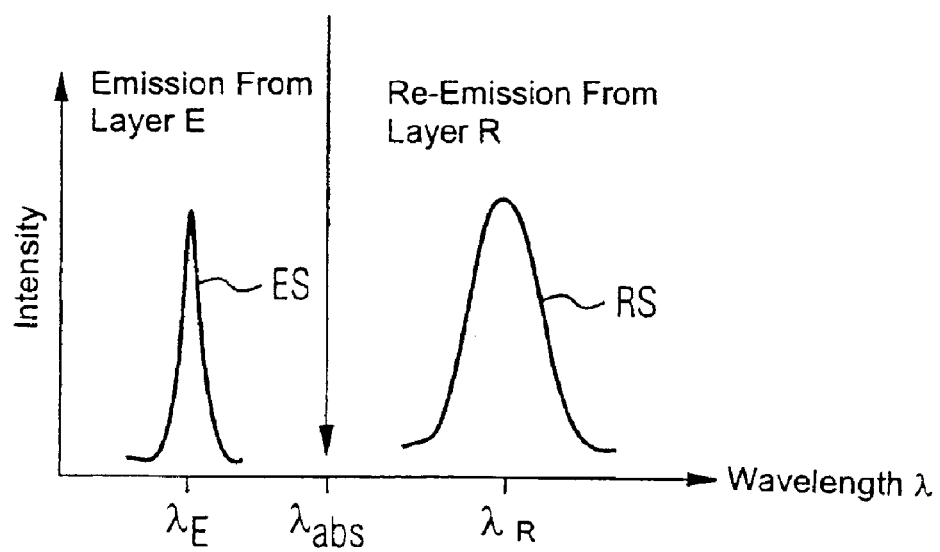
FIG. 4 is a graph illustrating a basic wavelength spectrum of a light-emitting diode chip according to the invention.

In the wavelength spectrum illustrated in FIG. 4, the wavelength $\lambda$ is plotted on the abscissa and the intensity is plotted on the ordinate, in each case without scaling. The emission spectrum ES of the emission layer E with a peak wavelength $\lambda_E$ is at shorter wavelengths than the re-emission spectrum RS of the re-emission layer R with a peak wavelength $\lambda_R$. The absorption edge K of the re-emission layer R lies at a wavelength $\lambda_{abs}$ between the emission spectrum ES and the re-emission spectrum RS.

Figure 5:
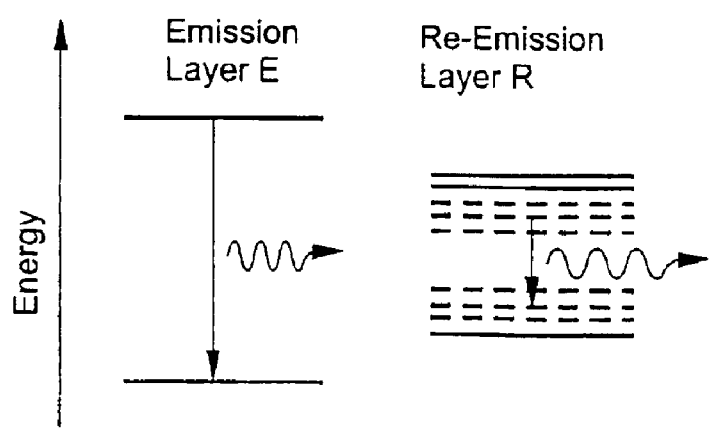
FIG. 5 is a graph illustrating a basic energy band scheme of a light-emitting diode chip according to the invention.

In the energy band scheme of FIG. 5, the energy is plotted vertically. The left-hand part shows the band gap of the emission layer E; the vertical arrow and the sinuous arrow indicate a radiant transition in the emission layer. The right-hand part of the band scheme shows the band gap of the re-emission layer R with states in the band gap. The vertical arrow and the sinuous arrow once again indicate a radiant transition in the re-emission layer. The re-emission in the re-emission layer R is excited by the radiation emitted the emission layer E.

A preferred material system for producing a semiconductor chip of this type is, for example, a second semiconductor layer E, which contains $Cd_xZn_{1-x}Se/ZnSe$ (where $0 \leq x \leq 1$), on a ZnSe substrate as first semiconductor layer R.

At room temperature ZnSe has a band gap of 2.7 eV, which corresponds to a wavelength of 460 nm. In many methods for growing bulk material, the high temperatures or the lack of purity of the starting materials have the result that impurities are inadvertently incorporated in the crystals, which can then lead to states in the band gap. Particularly pronounced room temperature luminescence around 600 nm is exhibited by conductive ZnSe substrates, as can be produced for example by subsequent heat treatment in zinc vapor or by doping with aluminum.

In this case, by way of example, a single ZnSe p-n diode with a (Cd,Zn)Se/ZnSe multiple quantum well system as active zone (electroluminescent region B), is suitable as the second semiconductor layer E. Depending on the cadmium content, the wavelength $\lambda_E$ of the radiation emitted by an active zone of this type can be shifted from the blue (460 nm) to the green (540 nm).

The absorption edge $\lambda_{abs}$ of the substrate is shifted toward about 515 nm through the use of a high iodine content. As a result, all the preconditions for a semiconductor component in accordance with the exemplary embodiment of FIG. 1 are fulfilled if, for example, a light-emitting diode structure with an emission wavelength of 489 nm and/or 508 nm is applied on the substrate.

The substrate used is preferably a ZnSe:I substrate produced through the use of Bridgeman growth. Further possible substrate growing methods are iodine transport growth and sublimation growth.

The substrate described above need not necessarily have served as a substrate during the growth process of the layers. Rather, it is also possible for contact between layer and absorption/re-emission substrate only to be produced afterward, for example by wafer bonding.

The desired mixed color or polychromatic radiation can be achieved through a suitable choice of the emitting layer (second semiconductor layer E) and of the substrate (first semiconductor layer R).

We claim:

1. A semiconductor component for generating visible polychromatic light, comprising:
   a semiconductor chip having a first semiconductor layer and a second semiconductor layer adjacent to said first semiconductor layer;
   said second semiconductor layer including an electroluminescent region emitting visible light of a first color having a first wavelength;
   said first semiconductor layer having a first band gap and being specifically doped to form states of allowed energy levels within said first band gap, said electroluminescent region having a second band gap, said first band gap being smaller than said second band gap;
   said first semiconductor layer absorbing part of the visible light of the first color and said first semiconductor layer re-emitting visible light of a second color having a second wavelength by a radiant transition involving said allowed energy levels within said first band gap, the second color being different from the first color, and the second wavelength being longer than the first wavelength; and
   said first semiconductor layer and said second semiconductor layer being configured to emit white light from said semiconductor chip by mixing the emitted and the reemitted visible light.

2. The semiconductor component according to claim 1, wherein:
   said first semiconductor layer includes a given material with an absorption edge having an energy level corresponding to a third wavelength, the third wavelength is longer than the first wavelength of the visible light emitted by said second semiconductor layer and is shorter than the second wavelength; and
   said given material, when excited with radiation of a wavelength shorter than the third wavelength, re-emits radiation of the second wavelength.

3. The semiconductor component according to claim 1, wherein a substrate for epitaxially growing said second semiconductor layer is also utilized as said first semiconductor layer.

4. The semiconductor component according to claim 1, wherein:
   said semiconductor chip includes a growth substrate; and
   said first semiconductor layer is disposed between said growth substrate and said second semiconductor layer.

5. The semiconductor component according to claim 1, wherein:
   said semiconductor chip includes a growth substrate for epitaxially growing said second semiconductor layer; and
   said second semiconductor layer has a side opposite said growth substrate, said first semiconductor layer is disposed on said side of said second semiconductor layer opposite said growth substrate.

6. The semiconductor component according to claim 1, wherein:

said first semiconductor layer includes doped ZnSe; and said second semiconductor layer has an active zone containing $Cd_xZn_{1-x}Se/ZnSe$ with $0 \leqq x \leqq 1$.

7. The semiconductor component according to claim 1, including a parabolic mirror, said semiconductor chip being disposed in said parabolic mirror.

* * * * *